United States Patent
Natsuhara et al.

(10) Patent No.: US 7,342,204 B2
(45) Date of Patent: Mar. 11, 2008

(54) HEATER AND HEATING DEVICE

(75) Inventors: Masuhiro Natsuhara, Itami (JP); Hirohiko Nakata, Itami (JP); Kenji Shinma, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/987,292

(22) Filed: Nov. 15, 2004

(65) Prior Publication Data

US 2005/0184055 A1    Aug. 25, 2005

(30) Foreign Application Priority Data

Nov. 20, 2003   (JP)   ............... 2003-390448

(51) Int. Cl.
*H05B 3/68* (2006.01)
*H05B 3/00* (2006.01)

(52) U.S. Cl. .................. 219/444.1; 427/592

(58) Field of Classification Search ............ 219/444.1, 219/543, 390; 118/724, 725; 427/592, 593
See application file for complete search history.

(56) References Cited

U.S. PATENT DOCUMENTS 6,160,244 A * 12/2000 Ohashi ............... 219/444.1
6,242,719 B1 * 6/2001 Kano et al. ............ 219/444.1
6,863,926 B2 * 3/2005 Lynn ..................... 427/250

FOREIGN PATENT DOCUMENTS

| JP | 07-307258 | 11/1995 |
|----|-----------|---------|
| JP | 2002-313890 | 10/2002 |

* cited by examiner

*Primary Examiner*—Sang Paik
(74) *Attorney, Agent, or Firm*—McDermott Will & Emery LLP

(57) ABSTRACT

A low-radiation-rate film, made of a material whose radiation rate is lower than that of a heater substrate, is formed at least entirely over the surface of a heat-subject-placing surface of a heater substrate. By applying patterning to the low-radiation-rate film, the exposure rate of the heater substrate is varied such that the radiation rate becomes smaller from the center part of the heat-subject-placing surface toward the outer peripheral part thereof, thereby enabling a uniform temperature across the surface. In addition, the power supply is reduced, thermal stress is eliminated, the wiring design flexibility is increased, and the reliability is increased by preventing short-circuit accidents.

9 Claims, 4 Drawing Sheets

Distance from center

HEATER AND HEATING DEVICE

TECHNICAL FIELD

The present invention relates to a to-be-placed-on-heat-subject heater member for heating a heat subject placed thereon, and a heat processor using the to-be-placed-on-heat-subject heater member.

BACKGROUND ART

Various types of heater members for heating a heat subject placed thereon have been conventionally proposed. For the purpose of heating semiconductor wafers, liquid crystal panel substrates, and others for processing, exemplified is a heater member mainly made of ceramic including aluminum nitride that provides high heat conductivity and high heat uniformity, or aluminum oxide that is low in price or others. As to such a heater member, various studies have been conducted with respect to its shape, structure, or the like, to achieve effective heating of heat subjects.

As a specific example of such a conventional heater member mainly made of ceramic-based material, as shown in FIG. 1, there is a heater member for use in a heat processor such as a semiconductor wafer. This heater member 1 is structured by a heater substrate 2 in which a ceramic base 4 is provided with a heat-generating wiring section 3, and a tubular support body 5 made of ceramic or others, and including a feed wiring configuration 6 electrically connected to the heat-generating wiring section 3, a thermocouple 7 for a heater temperature monitor, and the like. The heat-generating wiring section 3 provided to the heat substrate 2 is made of a conductive material exemplified by tungsten shaped to be substantially spiral.

The heat processor such as a semiconductor wafer carries the heater member 1 in a cabinet 8, and a heat subject 9 such as a semiconductor wafer is placed on the heat-subject-placing surface of the heater substrate 2 for various processing such as film formation, etching, or others during heat application. The issue here is that due to the recent fact that wafers have been increased in diameter, and semiconductor chips to be formed to such wafers have been reduced in size, for example, the heater member 1 is required to perform heat application with high accuracy, and the heat-subject-placing surface of the heater substrate 2 is required to be uniform in temperature to a greater degree. Moreover, for energy conservation purposes, the heating efficiency also is required to be increased.

As a measure taken thereto, a method is exemplarily proposed in JP-A-7-307258 to derive the uniformity for the inner surface temperature of a wafer during a heat process by placing a disk-shaped temperature compensation member in a manner such as to sandwich the wafer prior to the heat process. Moreover, in JP-A-2002-313890, a method is disclosed to heat a heat subject such as a wafer in an efficient manner by reducing the amount of heat coming from the heater member toward the outside with such a structure in which the surface(s) not including the heat-subject-placing surface is at least partially mirror finished.

DISCLOSURE OF THE INVENTION

In the case of a conventional heater member using the ceramic-based material, a generally-used ceramic material such as aluminum nitride, aluminum oxide, or others is often high in radiation rate. Therefore, other than heating the heat subject, the considerable amount of heat energy generated by the heater member is dissipated outside by radiation. As a result, the energy is often wastefully consumed, thereby being an obstacle to energy conservation.

In the design of the heat-generating wiring section of the heater member, consideration must also be given to the amount of energy to be dissipated outside by radiation, requiring a higher level of heat generation due to such dissipation. In view thereof, generally, the voltage value is increased for application to the heat-generating wiring section. On the other hand, with the increase of the temperature as a result of heating, the heat-generating wiring base is reduced in its insulation capability. Thus, increasing the application voltage leads to short-circuit accidents, whereby the reliability of the heater member is resultantly impaired.

Further, in a case where a semiconductor wafer or a liquid crystal panel substrate placed on the heater member is subjected to a film formation process using a material low in radiation rate such as tungsten or ruthenium, the surface of the heater member not carrying thereon the heat subject is layered with the above-described low radiation-rate material. On the other hand, the surface of the heater member carrying thereon the heat subject is not layered with anything and remains as the ceramic material. Accordingly, on the surface of the heater member after film formation, there exist the surface part made of ceramic high in radiation rate (radiation rate of about 0.8) and the surface part layered with the low radiation-rate material (radiation rate of about 0.1), thereby causing the radiation rate to vary locally and to an extreme. As a result, the low-radiation-rate part showing low heat dissipation is increased in temperature with respect to the high-radiation-rate part showing high heat dissipation, and this temperature difference generates stress in the heater member resulting from the thermal expansion difference, thereby leading to the occurrence of possible breakage trouble of the heater member.

Still further, in a case where the heat-subject-placing surface of the heater member is designed so as to have a uniform heat generation density over the entire surface, the outer circumferential part is generally lower in temperature compared with the center part. Thus, to make the heat-subject-placing surface entirely uniform in temperature, the heat generation density of the outer circumferential part is set higher than that of the center part. For example, with the heater including the heat-generating wiring section having the spiral wiring configuration, the wiring configuration of the outer circumferential part is narrower in wiring width or closer in wiring spacing. However, narrowing down the wiring width results in shorter life as a heating element, and having a closer wiring spacing results in lower insulation capability, and by extension, leads to short-circuit accidents. Therefore, it is not considered preferable in terms of reliability of the heater member. Moreover, the heater member is required to have sections, including an electrode terminal section for the heat-generating wiring configuration, a placement section for the thermocouple for the temperature monitor, an aperture section through which a protruding pin is inserted to lift heat subjects exemplified by a semiconductor wafer, a liquid crystal panel substrate, or others, a placement section for a support member to support the heater, and the like. Such subsidiary sections have been obstacles to achieving the uniform temperature on the heat-subject-placing surface, and moreover, have complicated pattern designing of the heat-generating wiring configuration to a greater degree, resultantly impairing the reliability and the heat uniformity of the heater member.

The invention is proposed in consideration of such conventional circumstances, and an object thereof is to provide, firstly, a to-be-placed-on-heat-subject heater member for heating a heat subject placed thereon more effectively than the conventional means with less power needed for the heater member to perform heat application up to a predetermined temperature while reducing the heat energy that is often wastefully dissipated, and a heat processor using such a to-be-placed-on-heat-subject heater member.

Another object of the invention is to provide, secondly, a to-be-placed-on-heat-subject heater member that is highly reliable in which the application voltage to the heater member can be reduced and preventing the occurrence of short-circuit accidents while reducing the heat energy that is often wastefully dissipated, and a heat processor using such a to-be-placed-on-heat-subject heater member. Thirdly, it is to provide a to-be-placed-on-heat-subject heater member that is highly reliable than ever and capable of preventing the occurrence of any damage caused by the thermal stress of the heater member, and a heat processor using such a to-be-placed-on-heat-subject heater member.

Fourthly, another object of the invention is to provide a to-be-placed-on-heat-subject heater member with which the design flexibility is increased for the heater member including a heat-generating wiring section so that the reliability and heat uniformity (temperature uniformity) are both further increased, and a heat processor using such a to-be-placed-on-heat-subject heater member.

To achieve the above objects, the to-be-placed-on-heat-subject heater member provided by the invention is characterized as being a to-be-placed-on-heat-subject heater member that performs heat application with a heat subject placed on a heater substrate, and at least entirely over the heat-subject-placing surface of the heater substrate is formed a low-radiation-rate film made of a material whose radiation rate is lower than the heater substrate. In such a to-be-placed-on-heat-subject heater member, the low-radiation-rate film is preferably formed almost entirely over the heater substrate and its support member.

Moreover, in the above to-be-placed-on-heat-subject heater member of the invention, the low-radiation-rate film is subjected to patterning to change the exposure rate of the heater substrate serving as a base layer for the heat-subject-placing surface of the heater substrate. With such a to-be-placed-on-heat-subject heater member, thanks to the low-radiation-rate film having been subjected to patterning as above, the radiation rate can be varied so that the radiation rate becomes lower from the center part of the heat-subject-placing surface of the substrate toward the outer peripheral part thereof.

Further, in the above to-be-placed-on-heat-subject heater member of the invention, the radiation rate of the low-radiation-rate film is preferably 0.5 or lower in the heating temperature for the heat subject, and more preferably 0.2 or lower. Still further, in the above to-be-placed-on-heat-subject heater member of the invention, the low-radiation-rate film is preferably made of at least one selected out of tungsten, ruthenium, aluminum, copper, silver, gold, platinum, nickel, lead, tin, silicon additive, carbon additive, and alloy thereof.

Furthermore, to achieve the above-described first to fourth objects, the invention is one that provides a heat processor that is characterized in including any of the above-described to-be-placed-on-heat-subject heater members of the invention, and performing heat application with a heat subject placed on a heater substrate for processing. An especially preferable heat processor is of a type in which the heat subject is either a semiconductor wafer or a liquid crystal substrate.

Still further, according to the invention, by using the above-described to-be-placed-on-heat-subject heater member of the invention, the heat subject can be heated uniformly and efficiently, and provided thereby is a highly-reliable heat processor consuming less energy. Accordingly, the heat processor of the invention is considered suitable as a system for applying various processes such as film formation and etching to semiconductor wafers and liquid crystal panel substrates while performing heat application.

BEST MODE FOR CARRYING OUT THE INVENTION

Figure 1:
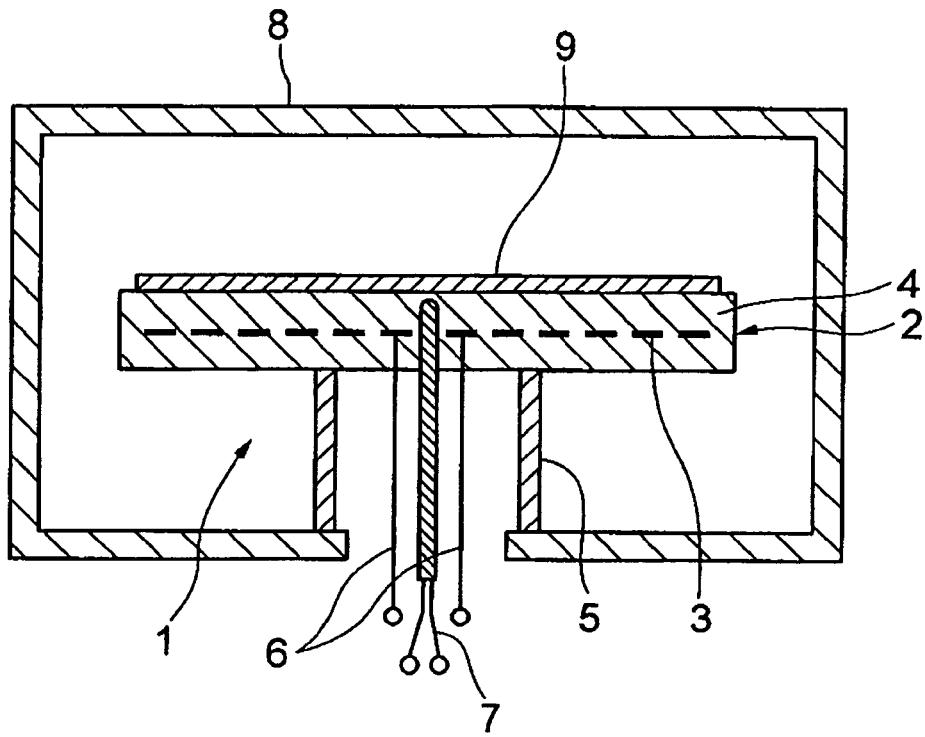
FIG. 1 is a schematic cross sectional view of a heat processor using a conventional to-be-placed-on-heat-subject heater member.
Figure 2:
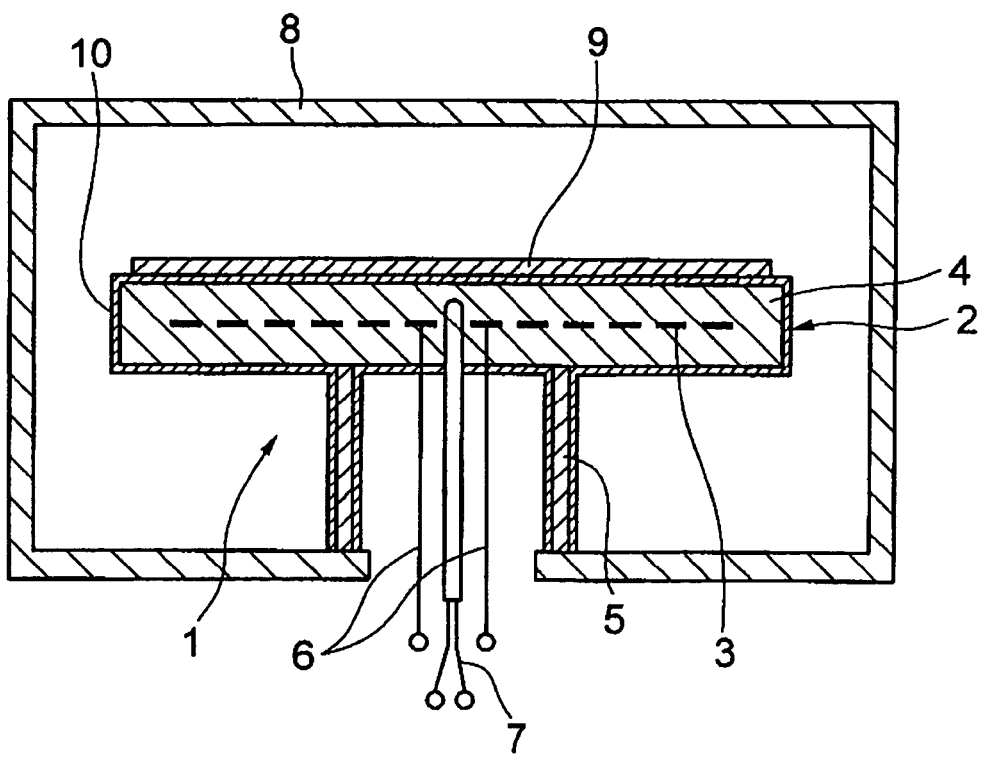
FIG. 2 is a schematic cross sectional view showing a specific example of a heat processor using a to-be-placed-on-heat-subject heater member of the invention.

A to-be-placed-on-heat-subject heater member of the invention is described by referring to FIG. 2 showing a specific example thereof. This to-be-placed-on-heat-subject heater member 1 has a basic structure similar to the conventional one shown in FIG. 1, is structured by a heater substrate 2 including a ceramic base 4 with a heat-generating wiring section 3, and a tubular support body 5 made of ceramic or others, and is provided with a feed wiring configuration 6 electrically connected to the heat-generating wiring section 3, a thermocouple 7 for monitoring the heater temperature, and the like. The to-be-placed-on-heat-subject heater member of the invention is formed with a low-radiation-rate film 10 entirely over at least the heat-subject-placing surface of the heater substrate 2 on which at least a heat subject 9 is to be placed.

As shown in FIG. 2, the low-radiation-rate film 10 is preferably formed entirely over both the heater substrate 2 and the support body 5. Moreover, the low-radiation-rate film 10 is formed at least over the heater substrate 2, and if this is the case, it is required to be formed entirely over the heat-subject-placing surface of the heater substrate 2, and optionally, it may be formed entirely over the surface of the heater substrate 2. For example, when the tubular support body 5 is formed mainly by a material having insulation capability, or when the support body 5 is not tubular but is structured by one or more narrow rods, the thermal interaction between the heater substrate 2 and the support body 5 is small. Thus, the support body 5 may not be formed with the low-radiation-rate film. What is more, if the low-radiation-rate film 10 is formed over the heat-subject-placing surface or the side surface of the heater substrate 2, the low-radiation-rate film may not necessarily be formed on the back surface thereof to achieve such effects as suppressing any wasteful heat dissipation compared with the conventional one.

The low-radiation-rate film according to the invention needs to be made of a material having a lower radiation rate than the base material used to structure the heater substrate. Generally, the base material used to structure the heater substrate is ceramic such as aluminum nitride or aluminum oxide, and thus the material will be one whose radiation rate is lower than such ceramic. A specific radiation rate for the low-radiation-rate film, in the heating temperature for a heat subject, is preferably 0.5 or lower, and more preferably 0.2 or lower.

A material considered desirable to structure the low-radiation-rate film includes tungsten, ruthenium, aluminum, copper, silver, gold, platinum, nickel, lead, tin, or others. Here, these metals may be added with silicon or carbon, or an alloy of these metals may be possibly be used. The respective radiation rates of the above-described metals are shown in Table I below.

TABLE I

| Low-radiation-rate Material | Radiation rate | |
|---|---|---|
| | 40° C. | 530° C. |
| Tungsten | 0.05 | 0.08 |
| Ruthenium (Abrasive surface) | 0.04 | 0.10 |
| Aluminum (Abrasive surface) | 0.04 | 0.08 |
| Aluminum (Oxide surface) | 0.08 | 0.18 |
| Copper (Abrasive surface) | 0.02 | 0.04 |
| Silver (Abrasive surface) | 0.02 | 0.03 |
| Gold (Abrasive surface) | 0.02 | 0.03 |
| Platinum (Abrasive surface) | 0.04 | 0.10 |
| Nickel (Abrasive surface) | 0.05 | 0.10 |
| Lead (Abrasive surface) | 0.05 | 0.08 |
| Tin (Gloss surface) | 0.05 | — |

The low-radiation-rate film can be formed with ease by any known vapor phase deposition exemplarily including PVD techniques such as sputtering and ion plating, CVD techniques such as plasma CVD, photochemical vapor deposition, and MO (Metal-Organic) CVD. Alternatively, to form the low-radiation-film, the low-radiation-rate material may previously be formed to be thin leaves, and the resulting low-radiation-rate leaves may be attached together by any known attachment technique. The thickness of the low-radiation-rate film to be formed is not specifically restricted because a thin film has the same level of radiation rate on its surface as a thick film. However, it is not preferable to have a low-radiation-rate film that is excessively thin, because no continuous film is formed and thus the base layer is partially exposed. Therefore, the low-radiation-rate film desirably has the thickness of 5 nm or more.

Note here that when the heater member is used as a susceptor needed for a heat process executed to semiconductor wafers or others, the heater member is first mounted to a PVD system or a CVD system, and prior to actually using it as a susceptor, the film-formation system may be used to form a low-radiation-rate film in advance. In such case, when the heater member has such a shape as shown in FIG. 2, the inner surface or outer surface of the tubular support body 5, or the back surface of the heater substrate 2 (the underside surface of the heat-subject-placing surface) may not be formed with the low-radiation-rate film 10, or even if it is formed therewith, the film may merely be formed thin. Even in such a case, the heat-subject-placing surface and the side surface of the heater substrate 2 are each formed with the required low-radiation-rate 10, and thus needless to say, the effects of the invention can be derived as already described above.

The heater member according to the invention has a low-radiation-rate film formed at least over the heater substrate, and thus when the heat-generating section is heated through a power supply provided to the feed wiring configuration, the amount of heat emitted from the surface of the heater member can be reduced to a considerable degree compared with the conventional heater member having no low-radiation-rate film. The results of actual measurement of power consumption for the heater substrate increased in temperature up to 570° C. and maintained at the temperature are shown in Table II below together with the radiation rate on the surface of the heater substrate. The heater substrate includes the heater substrate that belongs to the heater member of the invention, is made of disk-formed aluminum nitride having a diameter of 35 cm and thickness of 2 cm, and entirely over the surface thereof, is formed with a low-radiation-rate film made of tungsten. The heater substrate that belongs to the conventional heater member is made of the same base material but formed with no tungsten film. As is known from this Table II, the heater member of the invention has successfully achieved the reduction of power consumption of about 1000 W compared with the conventional heater member.

TABLE II

| | With low-radiation-rate film | With no low-radiation-rate film |
|---|---|---|
| Radiation rate on surface | 0.05 | 0.85 |
| Power consumption (W) | 590 | 1530 |

Moreover, in the heater member according to the invention, for example, the heater substrate carrying a low-radiation-rate film entirely over its surface is coupled together with a tubular support body similarly carrying a low-radiation-rate film entirely over its surface. Then as shown in FIG. 2, the resulting heater member 1 is further connected with the feed wiring configuration 6, the thermocouple 7 for monitoring the heater temperature, or others. The resulting heater member 1 is then mounted in the cabinet 8 of the system so that a heat processor incorporating the heater member can be derived. At this point, the low-radiation-rate film made of a metal such as tungsten is made conductive, and thus the components such as the feed wiring configuration 6 and the thermocouple 7 need to be subjected to an insulation process, e.g., application of an insulation coating, or insertion into an insulation tube.

With the heat processor structured as such, the amount of heat emitted from the surface of the heater member can be reduced to a considerable degree as described above. Accordingly, the electric power needed to perform heat application up to a predetermined temperature can be reduced, thereby leading to substantial energy conservation. What is more, due to the reduction of electric power going to the heater member as such, the voltage to be applied to the heater member can also be reduced. Accordingly, even if the insulation capability is reduced in the ceramic base material heated to a high temperature, short-circuit accidents rarely occur, favorably providing the heater member and the heat processor with a higher reliability than that of the conventional heating member and heat processor.

Moreover, using the heat processor of the invention, if an actual process is executed for film formation of a low-radiation-rate material such as tungsten on a heat subject such as a semiconductor wafer or a liquid crystal panel substrate, the low-rate-radiation material is layered on the surface part of the heater substrate where no heat subject is placed, and the low-radiation-rate material is not layered on the surface part where the heat subject is placed. On the other hand, with the heater member according to the invention, a low-radiation-rate film is previously formed at least on the heat-subject-placing surface of the heater substrate. Therefore, after film formation in the actual process, this means that the low-radiation-rate film already exists on the surface part where the heat subject is placed on the heater substrate. Accordingly, even if film formation is repeated in the actual process, the radiation rate varies minimally, thereby favorably avoiding the occurrence of possible damage to the heater substrate due to thermal stress. Therefore, the heater member and the heat processor can both be increased in reliability to a greater degree.

Further, with the to-be-placed-on-heat subject heater member of the invention, the low-radiation-rate film is subjected to patterning so that the exposure rate of the heater substrate serves as a base layer for the heat-subject-placing surface of the heater substrate. According to the low-radiation-rate film having been subjected to the patterning as above, the radiation rate can be varied so that the radiation rate becomes lower from the center part of the heat-subject-placing surface of the heater substrate toward the outer peripheral part thereof.

As having been conventionally done, if the heat-subject-placing surface of the heater substrate is designed to have a uniform heat-generating density over the entire surface, the outer circumferential part of the heat-object-placing surface is generally lower in temperature compared with the center part thereof. Thus, to make the surface entirely uniform in temperature, a complicated design operation of the heat-generating wiring section has been required in which the heat generation density of the outer circumferential part is higher than that of the center part, e.g., in the heat-generating wiring section, the wiring width is made narrower or the wiring spacing closer the wiring configuration in the circumferential part. Undesirably, narrowing down the wiring width results in shorter life of the heat-generating wiring section, and having a closer wiring spacing results in short-circuit accidents.

Therefore, by patterning applied to the low-radiation-rate film as above, the radiation rate distribution can be set for the heat-subject-placing surface in such a manner that the radiation rate becomes lower from the center part of the heat-subject-placing surface of the heater substrate toward the outer peripheral part thereof. As a result, with the heater member of the invention, the heat-subject-placing surface can be uniform in temperature, and measures can be taken to prevent life reduction of the heat-generating wiring section and the occurrence of short-circuit accidents without narrowing down the wiring width or having a closer wiring spacing in the heat-generating wiring section of the heater substrate. Consequently, the heater member can achieve high reliability and heat uniformity at the same time.

Figure 3A:
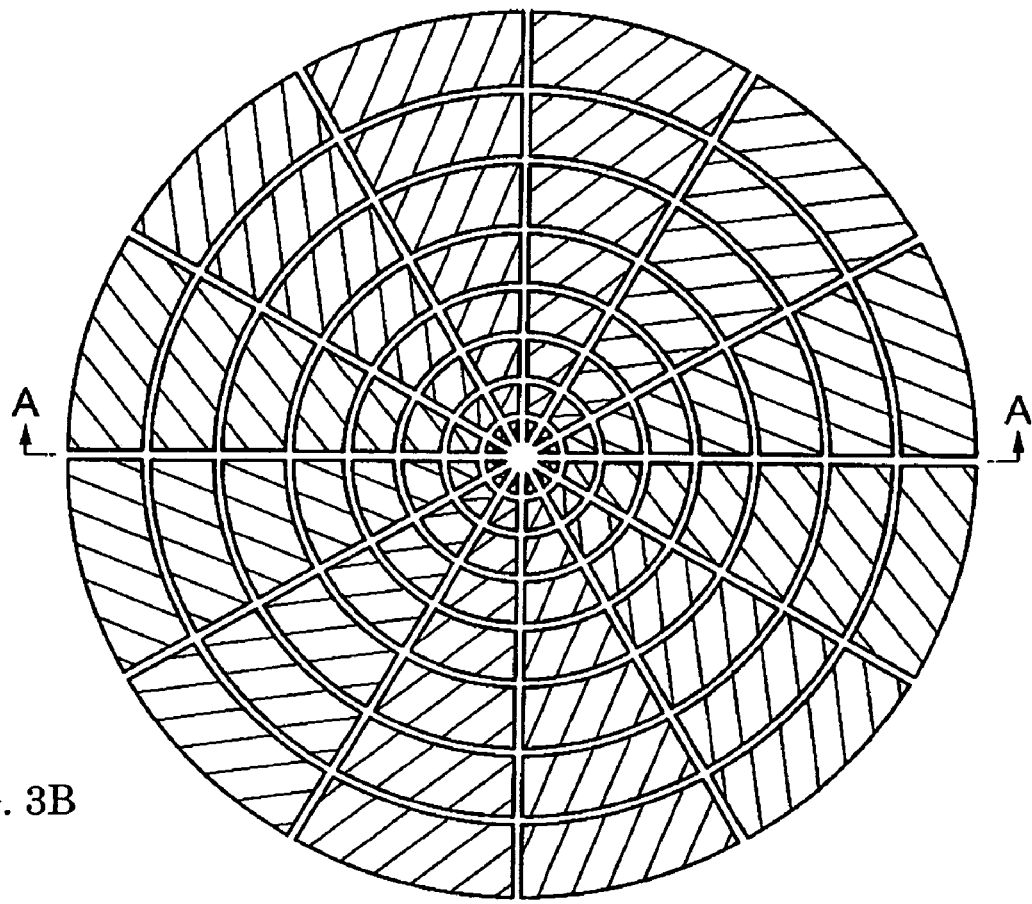
FIG. 3 shows a specific example of the to-be-placed-on-heat-subject heater member of the invention, and A is a schematic front view of a low-radiation-rate film after patterning, and B shows a radiation rate distribution thereof.
Figure 3B:
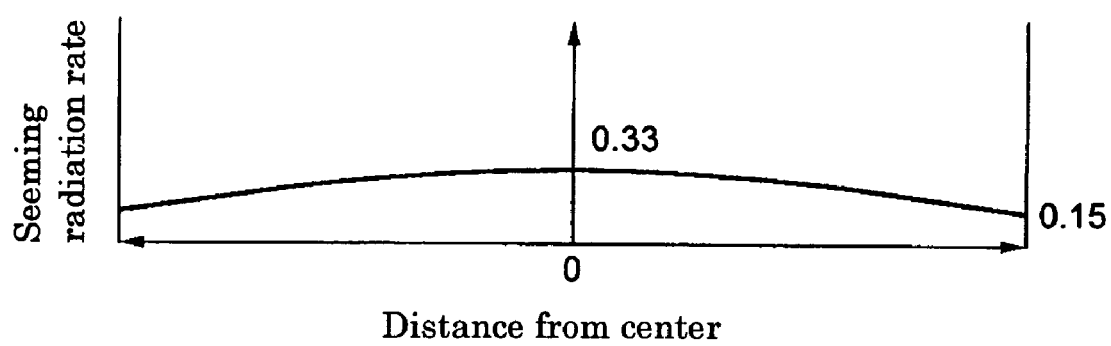
Figure 4A:
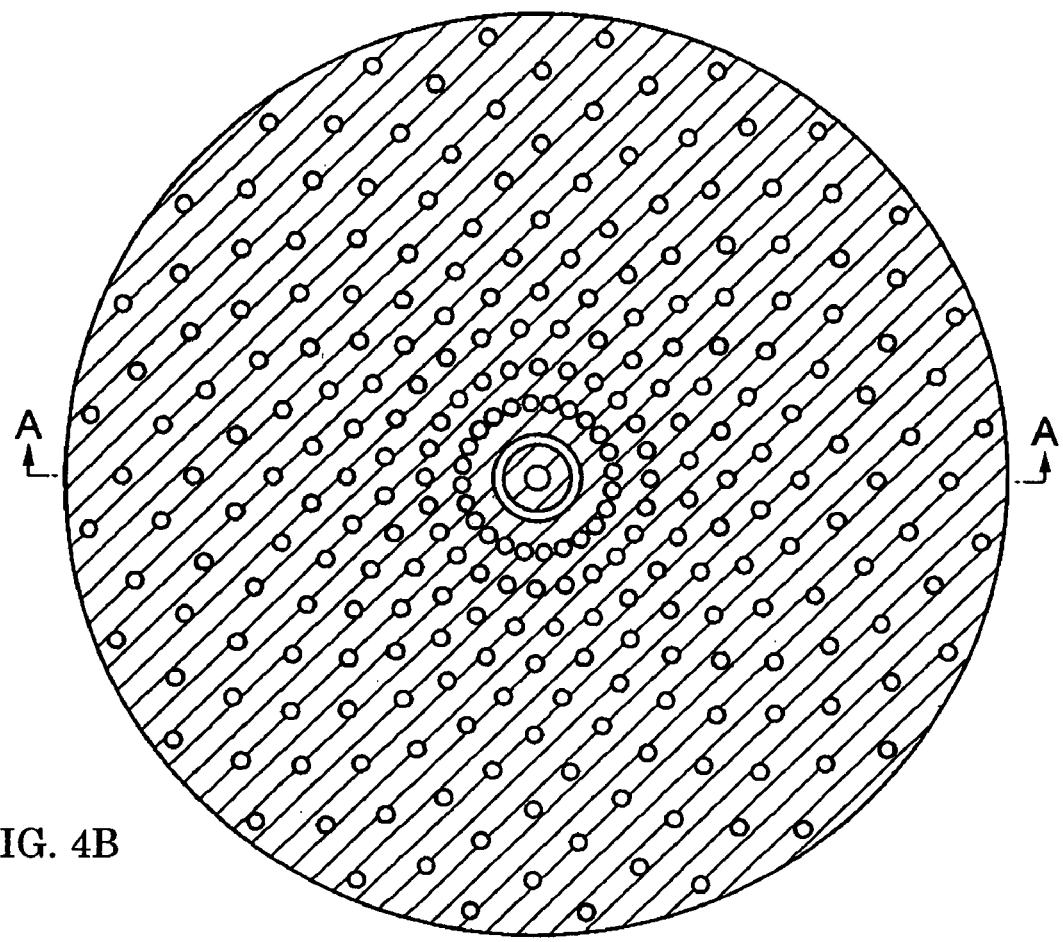
FIG. 4 shows another specific example of the to-be-placed-on-heat-subject heater member of the invention, and A is a schematic front view of a low-radiation-rate film after patterning, and B shows a radiation rate distribution thereof.
Figure 4B:
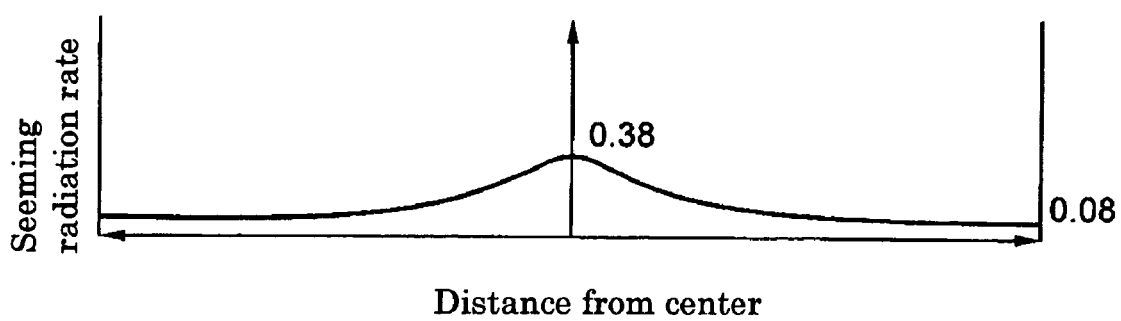

For example, FIGS. 3A and 4A show specific examples of a low-radiation-rate film having been subjected to patterning. In these drawings, the diagonally-shaded part indicates the low-radiation-rate film having completed patterning onto the surface of the disk-shaped heater substrate, and the remaining white part indicates the heat-subject-placing surface of the heater substrate (base layer) exposed through the low-radiation-rate film having completed patterning. With such patterning done, as to the heater substrate that serves as a base layer and is made of a high-radiation-rate material, the exposure rate becomes higher in the center part of the heater substrate, and becomes lower toward the outer peripheral part thereof. Such a structure successfully provides the radiation rate distribution to the heat-subject-placing surface of the heater substrate. The radiation rate along the line A-A of FIGS. 3A and 4A (partial average of radiation date: referred to as seeming radiation rate) shows such a distribution as shown in FIGS. 3A and 4A, respectively. That is, in FIG. 3B, the specific seeming radiation rate is 0.33 in the center part and 0.15 in the outer peripheral part, and in FIG. 4B, 0.38 in the center part, and 0.08 in the peripheral part.

Furthermore, the heater member manufactured generally for placement of semiconductor wafers or liquid crystal panel substrates includes a plurality of subsidiary elements being obstacles to achieve uniform temperature, e.g., an electrode terminal section for the heat-generating wiring section, a placement section for the thermocouple for monitoring the temperature, a protruding pin section to lift semiconductor wafers or liquid crystal panel substrates, a placement section for a support member to support the heater substrate, and the like. However, also with respect to such sections, patterning is applied to the low-radiation-rate film in a similar manner to the above to derive desirable radiation rate distributions. Thereby the temperature uniformity can be achieved to a greater degree, the design flexibility can be increased for the heat-generating wiring section, and by extension, the reliability can be improved.

Figure 5A:
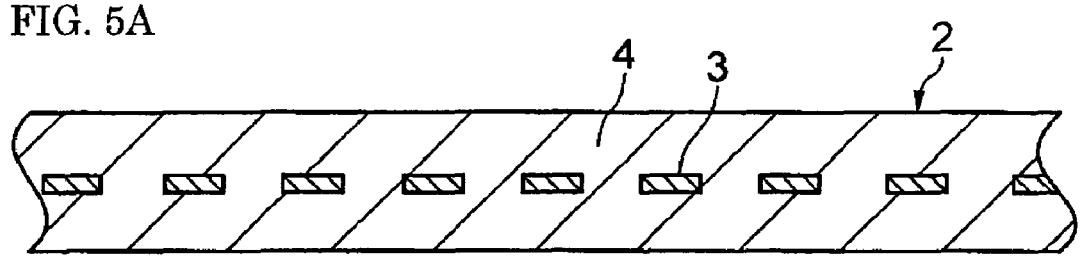
FIG. 5 is a schematic cross sectional view of the conventional to-be-placed-on-heat-subject heater member. A shows a part having no protruding pin, and B shows a part having a protruding pin.
Figure 5B:
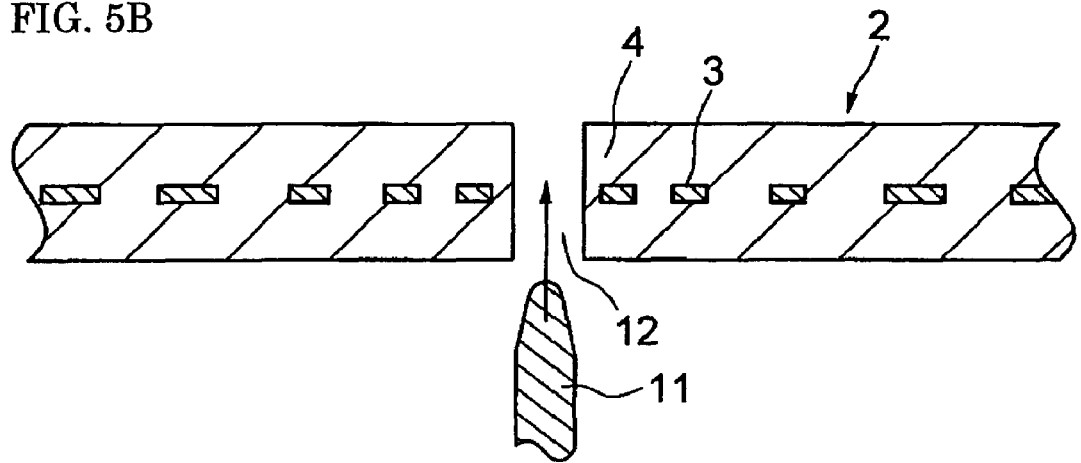

For example, with the conventional heater member, as shown in FIG. 5A, at the part of the heater substrate 2 having no aperture section, the heat-generating wiring section 3 placed in the base 4 has the same width and is placed with the same spacing. On the other hand, as shown in FIG. 5B, at the part where the aperture section 12 is provided through which the protruding pin 11 is inserted to go up and down, the heat-generating wiring section 3 has conventionally been reduced in wiring width or narrowed down in the wiring spacing, thereby the heater substrate 2 is increased in heat uniformity. The problem here is that, as already described in the foregoing, narrowing down the wiring width results in shorter life of the heat-generating wiring section, and having a closer wiring spacing results in lower insulation capability, and by extension, leads to short-circuit accidents.

Figure 6:
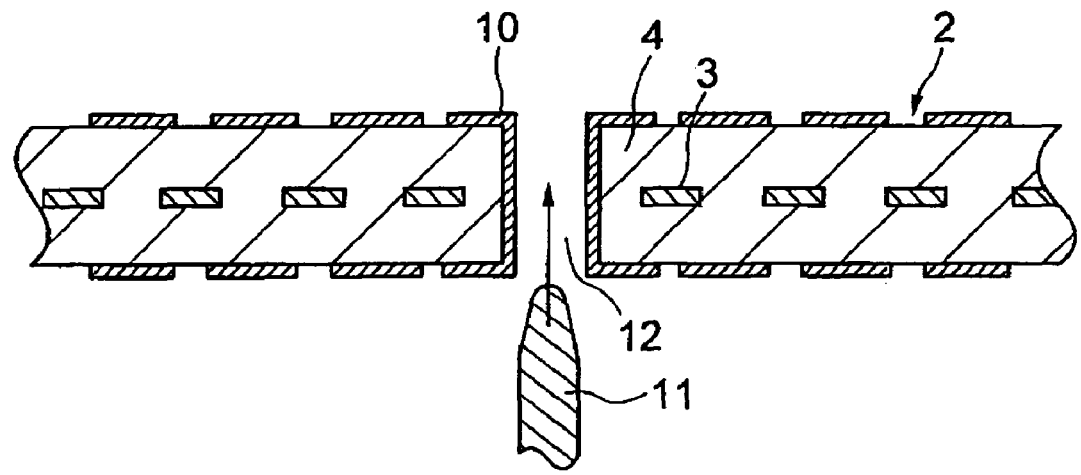
FIG. 6 is a schematic cross sectional view of a part of the to-be-placed-on-heat-subject heater member of the invention having a protruding pin.

On the other hand, with the heater member of the invention, as shown in FIG. 6, to place on the surface of the heater substrate 2 the low-radiation-rate film 10 having completed patterning, or the low-radiation-rate film not yet completed patterning, the low-radiation-rate film 10 may be formed also over the inner side surface and its circumferential part of the aperture section 12 through which the protruding pin 11 passes. Thereby, the coating rate is increased for the aperture section 12 and its circumferential part, favorably suppressing the heat dissipation from the aperture section 12. As a result, this eliminates the need for narrowing down the wiring width of the heat-generating wiring section 3 located around the aperture section 12 or having a closer wiring spacing. Consequently, the pattern shape of the heat-generating wiring section 3 can be simplified, achieving a wiring pattern design with more emphasis on heat uniformity. Moreover, the temperature uniformity can be improved to a greater degree on the heat-subject-placing surface of the heater substrate.

Actually, contrary to the heater member including a plurality of subsidiary elements being obstacles to achieve the uniform temperature, e.g., an electrode terminal section for the heat-generating wiring section, a placement section for the thermocouple for monitoring the temperature, an aperture section for insertion of a protruding pin, a placement section for a support member, and the like, the heater member of the invention is manufactured so that the low-radiation-rate film is formed as above to the aperture section through which the protruding pin passes to increase the coating rate. Then, a comparison is made in terms of heat uniformity with the conventional heater member having no low-radiation-rate film formed to the same aperture section. That is, the heater substrate is increased in temperature up to 570° C., and the temperature distribution is measured for the heat-subject-placing surface. The heat uniformity is as shown in Table III below, and the heater member of the invention is shown to have better heat uniformity.

TABLE III

| Heater member | Heat uniformity |
| --- | --- |
| Invention (with low-radiation-rate film) | 570° C. ± 0.15° C. |
| Conventional example (with no low-radiation-rate film) | 570° C. ± 0.49° C. |

As to the patterning of the above-described low-radiation-rate film, other than film formation utilizing a known metal mask, film formation is faciliated by a method utilizing known photolithography in which a resist film is subjected to patterning after film formation over its entirety, and the low-radiation-rate film is subjected to patterning by dry etching or other methods.

INDUSTRIAL APPLICABILITY

According to the invention, as to a to-be-placed-on-heat-subject heater member, measures can be taken to suppress the heat dissipation toward other than the heat subject, and to prevent local variation of the radiation rate. This thus leads to the reduction of electric power to be supplied to the heater member for heat application up to a predetermined temperature, whereby the heat subject can be heated in an efficient manner. In addition, the heat-subject-placing surface can be uniform in temperature to a greater degree, and damage caused by the thermal stress of the heater member can be suppressed. The design flexibility of the heater member can also be increased. Without narrowing down the wiring width or having a closer wiring spacing in the heat-generating wiring section, the heat-subject-placing surface can be uniform in temperature, and high insulation capability and long life can be achieved at the same time.

The invention claimed is:

1. A heater member for heating a heat subject placed thereon, the heater member comprising:
   a heater substrate having a heat generating element embedded in a base material; and
   a low-radiation-rate film made of a material having a radiation rate lower than the heater substrate formed at least entirely over a surface of a heat subject-placing surface of the heater substrate, wherein the low-radiation-rate film is patterned, and an exposure rate of the heater substrate serving as a base layer changes on the heat-subject-placing surface of the heater substrate.

2. The heater member according to claim 1, wherein the low-radiation-rate film is formed almost entirely over the heater substrate and a support member thereof.

3. The heater member according to claim 1, the radiation rate of the surface of the heater substrate is reduced from a center part toward an outer peripheral part.

4. The heater member according to claim 1, wherein the radiation rate of the low-radiation-rate film is 0.5 or lower at a heating temperature for the heat subject.

5. The heater member according to claim 4, wherein the radiation rate of the low-radiation-rate film is 0.2 or lower at the heating temperature for the heat subject.

6. The heater member according to claim 1, wherein the low-radiation-rate film is made of at least one member selected from the group consisting of tungsten, tungsten containing silicon, tungsten containing carbon, ruthenium, ruthenium containing silicon, ruthenium containing carbon, aluminum, aluminum containing silicon, aluminum containing carbon, copper, copper containing silicon, copper containing carbon, silver, silver containing silicon, silver containing carbon, gold, gold containing silicon, gold containing carbon, platinum, platinum containing silicon, platinum containing nickel, nickel containing silicon, nickel containing carbon, lead, lead containing silicon, lead containing carbon, tin, tin containing silicon, tin containing carbon, and alloys thereof.

7. The heater member according to claim 1, wherein the heat subject is either a semiconductor wafer or a liquid crystal panel substrate.

8. A heat processor comprising the heater member according to claim 1.

9. The heat processor according to claim 8, wherein the heat subject is either a semiconductor wafer or a liquid crystal panel substrate.

* * * * *